(12) United States Patent
Olsson

(10) Patent No.: US 7,082,876 B2
(45) Date of Patent: Aug. 1, 2006

(54) METHOD FOR TRANSFERRING A PATTERN

(75) Inventor: Lennart Olsson, Malmö (SE)

(73) Assignee: Obducat AB, Malmo (SE)

( * ) Notice: Subject to any disclaimer, the term of this patent is extended or adjusted under 35 U.S.C. 154(b) by 0 days.

(21) Appl. No.: 10/515,830

(22) PCT Filed: Jun. 5, 2003

(86) PCT No.: PCT/SE03/00901

§ 371 (c)(1),
(2), (4) Date: Nov. 26, 2004

(87) PCT Pub. No.: WO03/104898

PCT Pub. Date: Dec. 18, 2003

(65) Prior Publication Data

US 2005/0167847 A1   Aug. 4, 2005

Related U.S. Application Data

(60) Provisional application No. 60/386,414, filed on Jun. 7, 2002.

(30) Foreign Application Priority Data

Jun. 7, 2002   (SE)   .................................... 0201733

(51) Int. Cl.
*B41K 1/00*   (2006.01)
(52) U.S. Cl. ...................... 101/483; 438/690; 101/485
(58) Field of Classification Search ................ 257/797; 101/483, 486
See application file for complete search history.

(56) References Cited

U.S. PATENT DOCUMENTS

| 5,669,303 | A | | 9/1997 | Maracas et al. |
| 6,109,175 | A | * | 8/2000 | Kinoshita ................... 101/170 |
| 6,316,163 | B1 | * | 11/2001 | Magoshi et al. ............ 430/296 |
| 6,655,286 | B1 | * | 12/2003 | Rogers ........................ 101/485 |
| 6,966,997 | B1 | * | 11/2005 | Inganas et al. ................ 216/36 |

FOREIGN PATENT DOCUMENTS

| WO | WO 01/33300 A2 | 5/2001 |
| WO | WO 01/42858 A1 | 6/2001 |
| WO | WO 01/69317 A1 | 9/2001 |

* cited by examiner

*Primary Examiner*—Thao P. Le
(74) *Attorney, Agent, or Firm*—Finnegan, Henderson, Farabow, Garrett & Dunner, L.L.P.

(57) ABSTRACT

A method and a device for forming at least a first pattern on a substrate (6,28), which is coated with a layer (5) on at least a first planar surface, are described. According to the method, a first pressing means (27) is arranged with a first structure (32) that defines the pattern, and the substrate (28) is arranged so that the first pressing means (27) is separated from the substrate (28) and so that the first pressing means (27) and the substrate (28) are unable to move transversely of the common center line (50) but are able to move freely in a direction along the center line (50). Subsequently, the first pressing means (27) is contacted with the substrate (28) while maintaining the common center line, and a pressure is applied to the substrate (28) and the first pressing means (27) to form said at least one pattern in the layer (30)

17 Claims, 4 Drawing Sheets

METHOD FOR TRANSFERRING A PATTERN

This application claims priority of provisional application No. 60/386,414 filed Jun. 7, 2002.

This application is a 371 of PCT/SE03/00901 filed Jun. 5, 2003

FIELD OF THE INVENTION

The present invention relates to a method and a device for transferring a pattern from a pressing means to an object.

BACKGROUND ART

Among other things in the semiconductor industry and in the manufacture of optical storage media, a pattern is to be transferred to an object. There are a number of different techniques for transferring a pattern to an object, such as optical lithography and electron beam lithography. A technique which has recently come into use and which, for instance, is used for manufacturing CDs (compact disks) is transferring a pattern by pressing.

PCT Application SE01/00527 discloses a device and a method for transferring a pattern from a pressing means to a substrate, which is provided with a layer, by means of pressing. In the application, a technique to obtain an even pressure over the entire surface of the pressing means is described.

In the manufacture of, among other things, rotating storage media, it is important for the pattern which is being transferred to the object to be centered in relation to a central rotational axis.

However, SE01/00527 does not teach how the pattern can be centered in relation to a rotational axis.

In the semiconductor technique, a pattern is often aligned to another pattern by means of alignment marks provided, respectively, on the substrate to which the pattern is to be transferred and on the mask from which the pattern is to be transferred.

One example of a technical field with a great need for pattern alignment is the manufacture of the new generation hard disks, in which the surface has been formed with a structure to obtain a high storage capacity. Traditional hard disks are provided with a magnetic layer on both sides. When formatting the hard disk, magnetic areas are defined simultaneously on both sides of the hard disk by means of a read/write fork on each side. In order to increase the storage capacity, the size of the magnetized areas has traditionally been reduced. These areas can, however, only be reduced to a certain limit before an area is affected by adjacent areas to such a degree that the storage of data in one area changes data in an adjacent area.

One way of solving this problem is to define magnetic areas in advance in each layer, the areas being separated by a non-magnetic material.

In this case, however, it is necessary for the magnetic areas on both sides to be situated at the same radial distance from the rotational axis to enable the read fork to read and write on both sides simultaneously. It is of less importance that the areas are not situated in the same positions in the tangential direction.

Thus, there is a need for a method and a device for aligning a substrate in relation to a pressing means with a structure.

There is also a need for a method and a device for aligning two pressing means in relation to each other and in relation to a substrate.

SUMMARY OF THE INVENTION

An object of the present invention is to solve at least one of the problems described above.

It is also an object of the present invention to provide a method and device for aligning a pressing means in relation to a substrate.

Another object of the present invention is to provide a method and a device for aligning two pressing means, each provided with a structure, in relation to each other and in relation to an object.

At least one of these objects is achieved by means of a method, a device and use according to the independent claims. Further features of the invention will appear from the dependent claims.

It is a basic idea of the invention to use a mechanical alignment means to align the pressing means and the substrate, the alignment not being sensitive to variations in the geometric dimensions of the pressing means or the substrate.

A method according to the invention is used for forming at least a first pattern on a substrate, which is coated with a layer on at least a first planar surface. The method is characterized in that it comprises the steps of arranging in the following order a first pressing means, which has a first surface with a first structure that defines the first pattern, and the substrate so that the center of the substrate and the center of the first structure are arranged on a common center line, and so that the first surface of the first pressing means is facing and is separated from the first planar surface of the substrate and so that the first pressing means, the second pressing means and the substrate are unable to move transversely of the common center line but are able to move freely in a direction along the center line. The method further comprises the steps of contacting the pressing means with the substrate while maintaining the common center line, and applying a pressure to the substrate and the first pressing means to form said at least one pattern in the layer.

By using a means with the above features, the pressing means and the substrate are automatically centered. It is relatively easy to provide such alignment.

A method according to the invention can, of course, be adjusted so as also to form a first pattern and a second pattern on each side of a substrate. In this case, it is possible that it is desirable only to center the first pattern in relation to the second pattern. If so, the substrate does not have to be arranged so that it is unable to move transversely of the common center line.

A method for forming a first pattern and a second pattern on a substrate, which has at least a first and a second planar surface which are coated with a first and a second layer, respectively, is characterized in that it comprises the step of arranging in the following order a first pressing means, which has a first surface with a first structure that defines the first pattern, the substrate and a second pressing means, which has a second surface with a second structure that defines the second pattern, so that the centers of the first and the second structure are arranged on a common center line. The pressing means and the substrate are arranged so that the first surface of the first pressing means is facing and is separated from the first planar surface of the substrate, so that the second surface of the second pressing means is facing and is separated from the second planar surface of the substrate, and so that the first pressing means and the second pressing means are unable to move in relation to each other perpendicular to the common center line but are able to move in a direction along the center line. After that, the pressing means are contacted with the substrate while maintaining the common center line, and a pressure is applied to the first and the second pressing means to form the patterns in the layers.

If it is desirable to center the patterns also in relation to the substrate, also the substrate is arranged with its center on the common center line.

It is possible to provide the alignment with the aid of a means which acts on the peripheries of the pressing means and the substrate. However, it is only by means of a method, in which the pressing means and the substrate are centered with the aid of through-holes in the pressing means and the substrate, that the full extent of the invention is exploited and a less complicated method is obtained.

If the substrate and the pressing means are centered by means of through-holes, a center through-hole is provided in the substrate, which center hole has a center axis that extends through the center of gravity of the substrate and coincides with a normal direction of said planar surfaces. The first pressing means has a first through-hole, which has a center axis that coincides with a normal direction of said first surface of said first pressing means. If a second pressing means is provided, this is provided with a second through-hole, which has a center axis that coincides with a normal direction of said second surface of said second pressing means. The step of arranging the center of said substrate and the centers of said first and, possibly, second structures on a common center line comprises arranging said substrate and said first and, possibly, second pressing means on a mandrel, which is arranged to extend through said center hole, first hole and, possibly, second hole. A mandrel which is arranged to extend through said center hole in the manner described above is much easier to manufacture than a means which is arranged to engage the peripheries of the substrate and the pressing means.

According to one embodiment, said center hole, the first hole and the second hole are uniform and preferably circular. The mandrel is relatively easy to manufacture if it is intended for uniform holes and in particular if intended for circular holes.

According to one embodiment, the mandrel has a conical portion, in particular a conical portion which is circular in cross-section. This shape is easy and thus cheap to manufacture.

According to one embodiment, the largest cross-sectional area of said conical portion is larger than said first hole which is larger than said center hole which is larger than said, possibly, second hole. Consequently, the active part of the mandrel consists of a conical portion only. Naturally, it is possible as an alternative to use a mandrel with several conical portions.

A method as stated above can be used in various ways. It can, for instance, be used to manufacture two-sided rotating storage media or to manufacture hard disks.

According to one embodiment of the-invention, a method is provided for forming a first pattern and a second pattern on a substrate, which has at least a first and a second planar surface which are coated with a first and a second layer, respectively. The method is characterized in that it comprises the steps of arranging in the following order a first pressing means, which has a first surface with a first structure defining the first pattern and which has a first circular through-hole, the center line of which is perpendicular to the first surface and which is centered in relation to the pattern, the substrate and a second-pressing means, which has a second surface with a second structure defining the second pattern and which has a second circular through-hole, the center line of which is perpendicular to the first surface and which is centered in relation to the pattern, on a conical mandrel of circular cross-section. The largest diameter of the mandrel is larger than the biggest hole. The pressing means and the substrate are arranged with the first surface of the first pressing means facing and being separated from the first planar surface of the substrate, and the second surface of the second pressing means facing and being separated from the second planar surface of the substrate.

Subsequently, the pressing means are contacted with the substrate while maintaining the common center line, and a pressure is applied to the first and the second pressing means to form the patterns in the layers.

According to one embodiment of the invention, use is provided of a conical mandrel, which is circular in cross-section, to align at least a first pressing means, with a first pattern, in relation to a substrate when transferring the pattern to the substrate by pressing, the pressing means having a first circular through-hole which is centered in relation to the pattern and the substrate having a second circular through-hole.

According to yet another aspect of the present invention, a device is provided for forming at least a first pattern from a first pressing means with a first structure to a plate-shaped substrate, which is coated with a layer on at least a first planar surface. The device comprises a first holding means and a second holding means for receiving one of the substrate and the first pressing means each, the device being arranged to apply a pressure between the first and the second holding means. The device further comprises a centering means, which is movable in relation to the second holding means and which is arranged in such a manner that the center of the substrate and the center of the first structure are arranged on a common center line, that the first planar surface of the substrate is separated from the structure and that the first pressing means and the substrate are separated from the second holding means and are unable to move perpendicular to the common center line but are able to move freely in a direction along the center line, when the substrate and the pressing means are arranged on the centering means, when the centering means is in a first working position, with the structure facing the first planar surface. The device is also arranged so that the first planar surface of the substrate is in contact with the structure and arranged on the same center line, and one of the substrate and the pressing means is in contact with the second holding means when the centering means is in a second working position. The device is further arranged to contact the first holding means with the substrate/the pair of pressing means before a pressure is applied between the first and the second pressing means.

By such a device it is relatively easy to transfer a pattern to the substrate. According to a further aspect of the invention, a device is provided for forming at least a first pattern from a first pressing means with a first structure to a plate-shaped substrate, which is coated with a layer on at least a first planar surface. The device comprises a first holding means and a second holding means for receiving one of the substrate and the first pressing means each, the device being arranged to apply a pressure between the first and the second holding means. The device is characterized in that it further comprises a centering means in the form of a cone, which is movable in relation to the second holding means and which is arranged in such a manner that the first planar surface of the substrate is separated from the structure and that the first pressing means and the substrate are separated from the holding means, when the substrate and the pressing means are arranged on the centering means when the centering means is in a first working position, that the first planar surface of the substrate is in contact with the structure and arranged on the same center line, and one of the substrate and the pressing means is in contact with the second holding means when the centering means is in a second working position, the device being arranged to contact the first holding means with the substrate/the pair of pressing means before a pressure is applied between the first and the second pressing means. By means of a device with a centering means in the form of such a cone, it is easy to center the substrate and the pressing means. A cone is easy to manufacture, for instance, by turning. It goes without saying that it is conceivable to arrange a pressing means on each side of the substrate if it is desirable to make a pattern on each side of the substrate.

The features which have been described in connection with the method can be implemented also in the device after suitable adjustments.

Naturally, the features mentioned above can be combined in the same embodiment.

Below embodiments of the invention will be described with reference to the accompanying drawings.

DESCRIPTION OF PREFERRED
EMBODIMENTS OF THE INVENTION

Figure 1:
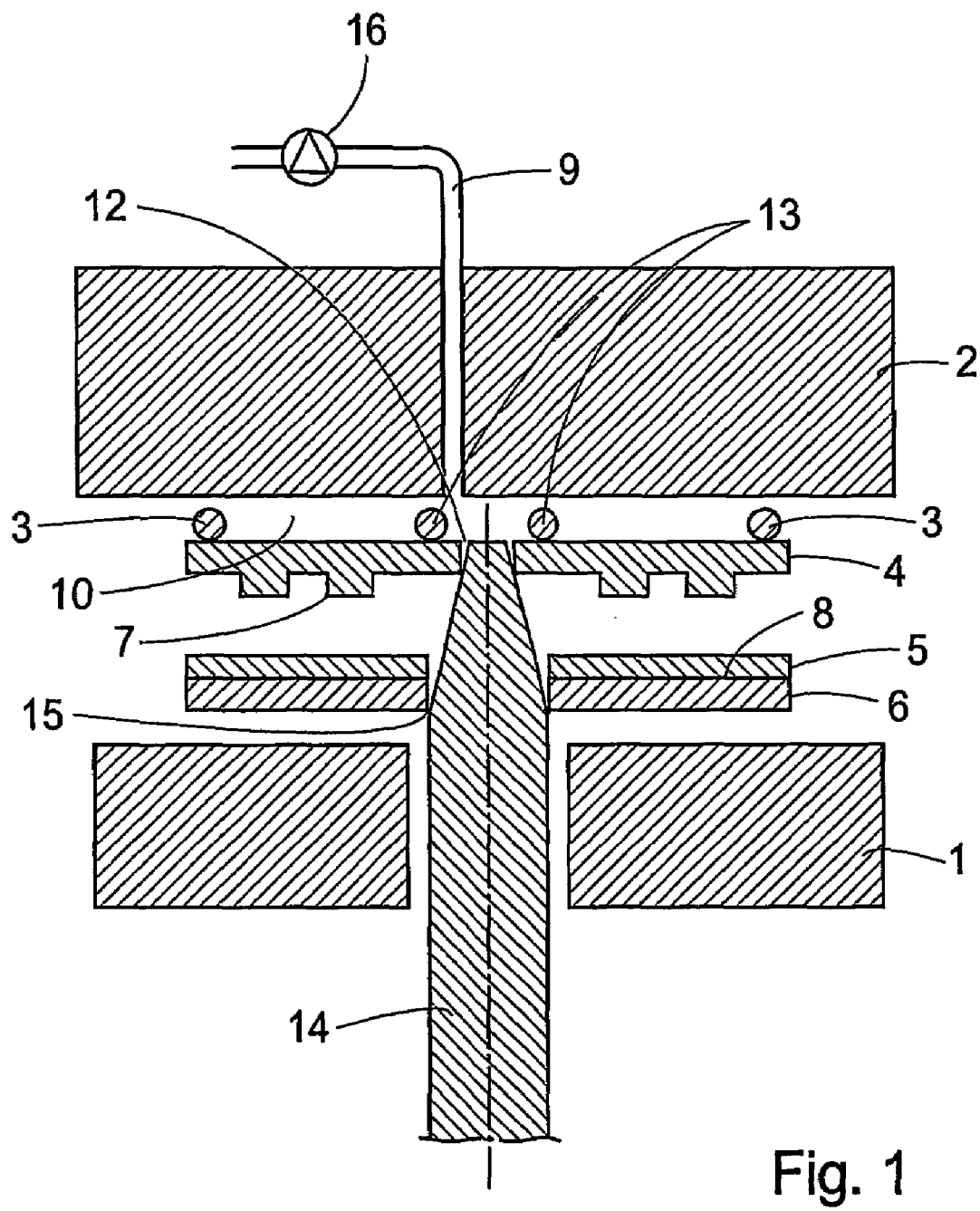
FIG. 1 illustrates a method according to a preferred embodiment of the invention.

FIG. 1 illustrates a method according to a preferred embodiment of the invention. FIG. 1 shows a first holding means 1 and a second holding means 2 between which a pressure can be applied to press together a pressing means 4, which is provided with a structure 7, and a substrate 6, which on a first planar surface 8 is provided with a layer 5. Between the pressure means and the first holding means, a first sealing ring 3 and a second sealing ring 13 are arranged to form a chamber 10 which can be used to create a pressure by means of which the pressing means is pressed into the layer. The chamber 10 is formed when the first holding means has contacted the sealing rings. The pressure is generated by injecting high-pressure gas through the conduit 9. At the center of the second holding means 2, a centering means 14 protrudes which has a conical portion of circular cross-section at its top. In the pressing means, a first circular through-hole 12 is arranged which has the same diameter as the upper part of the centering means 14. In the substrate 6 and its layer 5, a corresponding second through-hole 15 is made which is larger than the first circular through-hole 12. As a result, the substrate and the pressing means are held by the conical centering means 14. The diameters of the first circular through-hole 12 and the second circular through-hole 15 as well as the conicity and the diameter of the centering means 14 are adjusted to each other so that the substrate and the pressing means 4 are kept in such positions that a gap is provided between the structure 7 on the pressing means 4 and the layer 5 on the substrate 6. The centering means 14 is advantageously made in one piece in a turning lathe, which enables the peripheral surfaces of the centering means 14 to be satisfactorily centered.

When using the centering means 14, the substrate 6 and the pressing means 4 are arranged on the centering means 14, in this order, the structure on the pressing means facing the layer 5 on the substrate 6. After that, the first holding means 1 is raised towards the second holding means 2 so that the first holding means. 1 first contacts the substrate 6, that the layer 5 subsequently contacts the structure on the pressing means 4 and that the pressing means 4 finally contacts the sealing rings 3 and 13. The first holding means 1 moves in the axial direction. Owing to this, the alignment between the pressing means 4 and the substrate 6 is maintained.

After being brought together, a pressure is applied to the pressing means 4 by filling the chamber 10 with gas through the conduit 9. Thereby the pattern defined by the structure 7 is transferred to the layer 5. The first through-hole 12 in the stamp is centered in relation to the second through-hole 15 in the substrate. As a result, the pattern, which is made in the layer 5, is centered in relation to the second through-hole 15 in the substrate.

Figure 2:
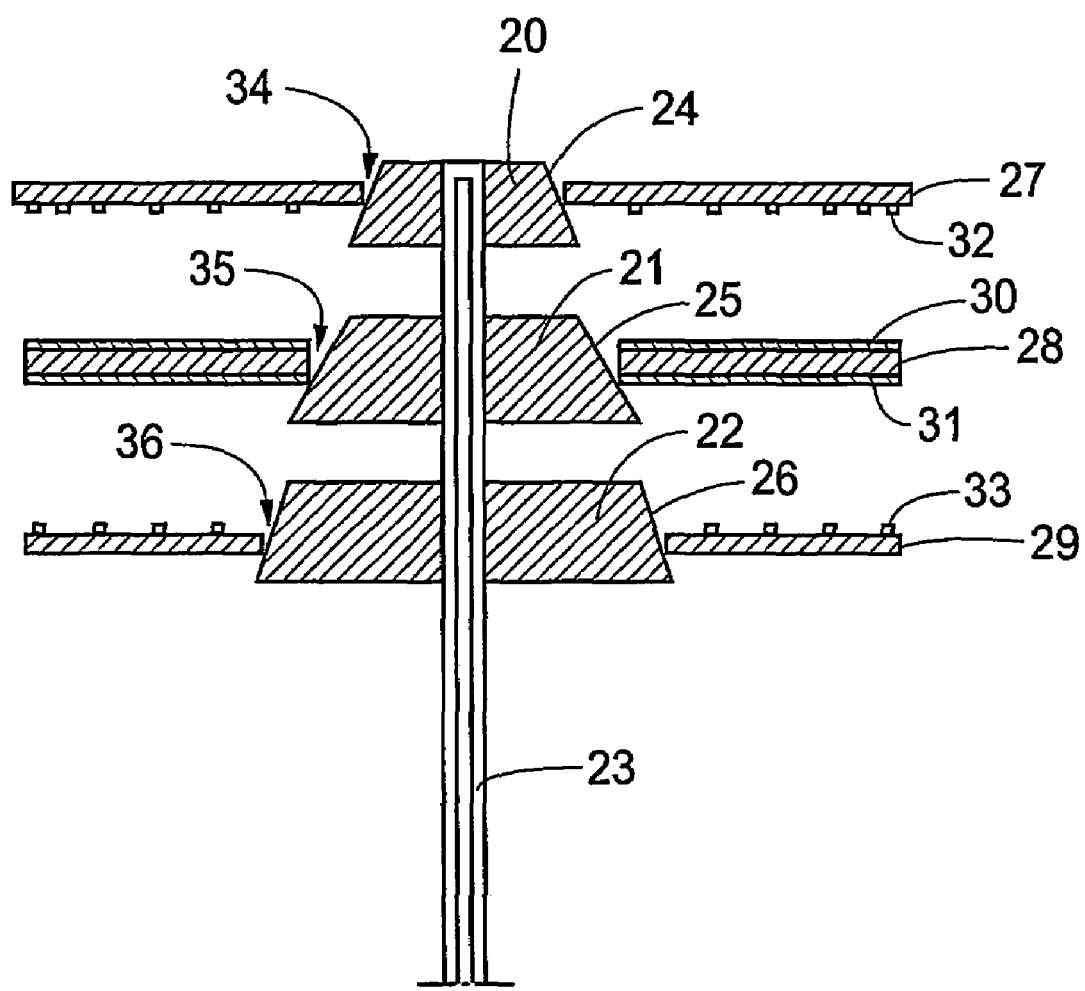
FIG. 2 shows a pressing means according to a preferred embodiment of the invention.

FIG. 2 shows an alternative embodiment of the present invention. In FIG. 2, the centering means is formed as a first partial means 20, a second partial means 21 and a third partial means 22, which are fixedly arranged on a mounting pin 23. Each of the partial means has a conical surface 24, 25, 26 which is circular in cross-section. Each of the conical surfaces 24, 25, 26 has a symmetry axis which coincides with that of the mounting pin 23 on which they are arranged. The conical surfaces 24, 25, 26 are machined when the partial means are arranged on the mounting pin 23. It is thus possible to achieve good conformity between the symmetry axes of the conical surfaces and the symmetry axis of the mounting pin 23.

In FIG. 2, a first pressing means 27 is arranged on the first partial means 20, a substrate 28 is arranged on the second partial means 21 and a second pressing means 29 is arranged on the third partial means 22. The first pressing means 27 is provided with a first structure 32, on the side facing the substrate 28. The substrate 28 is provided with a first layer 30, which is facing the first pressing means 27, and a second layer 31 which is facing the second pressing means 29. The second pressing means is provided with a second structure, on the side facing the substrate 28.

The first pressing means 27 is provided with a first through-hole 34. The substrate is provided with a second through-hole 35. The second pressing means 29 is provided with a third through-hole 36. The through-holes are arranged in relation to the partial means in such a manner that the substrate 28 and the pressing means 27, 29 each get stuck to one of the partial means 20, 21 and 22. After having centered the pressing means 27, 29 and the substrate 28 by placing them on the centering means, they are brought together in a manner corresponding to that described in connection with FIG. 1 and subsequently the first pressing means is pressed together with the second pressing means so that the pattern is transferred to the first layer 30 and the second layer 31 on the substrate 28. The structure 32 on the first pressing means 20 is centered in relation to the first through-hole 34. The structure on the second pressing means 22 is similarly centered in relation to the third through-hole 36. As a result, when pressing the first pressing means and the second pressing means together with the substrate in between them, the patterns which are made in the first layer 30 and the second layer 31, respectively, will be centered in relation to each other.

Figure 3:
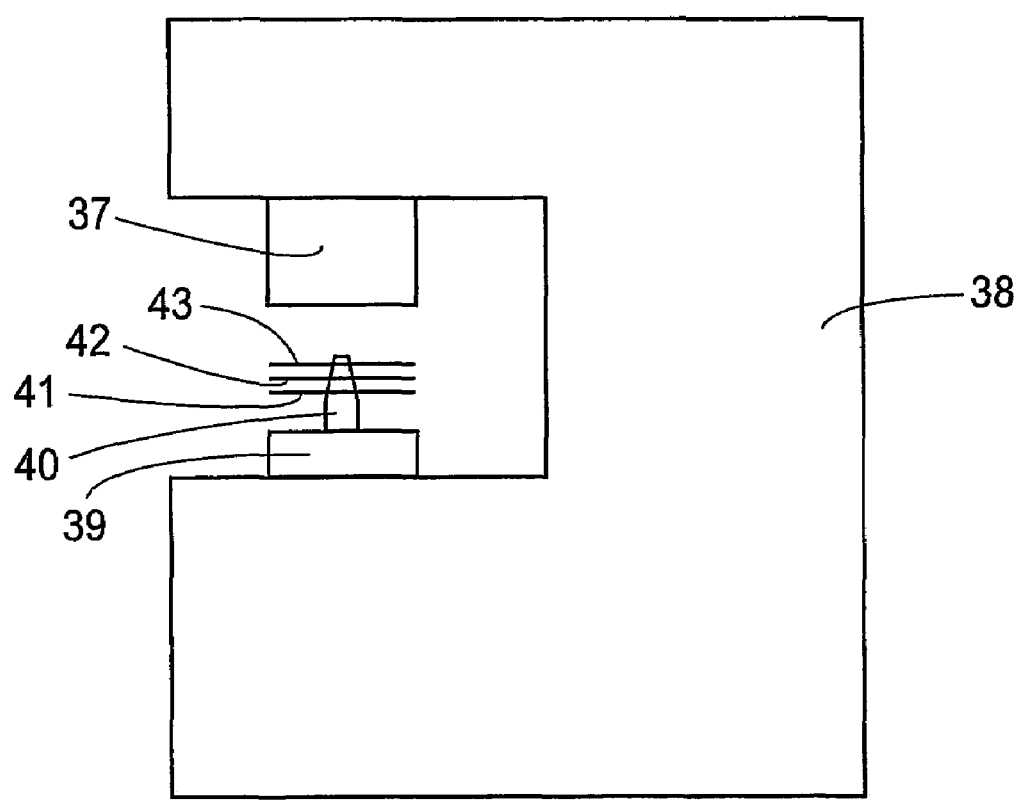
FIG. 3 shows a device according to an alternative embodiment of the invention.

FIG. 3 shows a device according to the invention in the form of a press which can be used to transfer a pattern to a layer on a substrate. The device has a first holding means 37 which is fixedly arranged in relation to the frame structure 38 of the device, a second holding means 39 which is movable in the vertical direction in relation to the first holding means and which is arranged to apply a static pressure in the vertical direction. Centrally in the second holding means 39, a centering means 40 is arranged, which is, for instance, of the kind described in connection with FIG. 1. When using the press in FIG. 3, the following elements are arranged as described with reference to FIG. 2: a first pressing means 41 with a first structure arranged on the side facing upwards, a substrate 42 with a layer on each side and then a second pressing means 43 with a second structure arranged on the side facing downwards.

After having placed the substrate 42 and the pressing means 41, 43 on the centering means, the second holding means 39 is raised so that the pressing means 41, 43 and the substrate 42 contact each other and are clamped between the first holding means 37 and the second holding means 39. Subsequently, a pressure is applied between the first holding means 37 and the second holding means 39 so that the structures in the pressing means are transferred to patterns in the layers.

Figure 4:
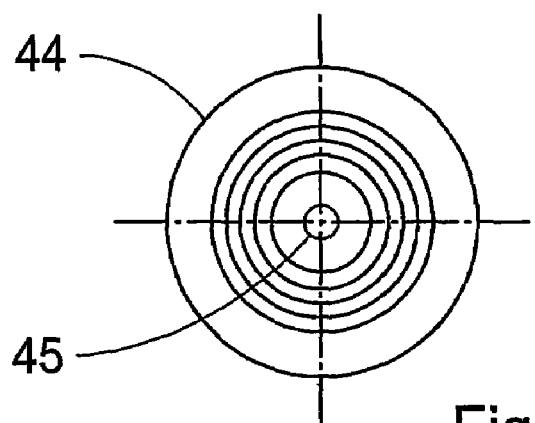
FIG. 4 shows a pressing means according to an embodiment of the invention.

FIG. 4. shows a pressing means 44 of circular shape through which a through-hole 45 is made. On the surface of the pressing means, a structure is arranged in the form of concentric circular raised portions 46. The hole 45 is centered in relation to the raised portions.

Figure 5:
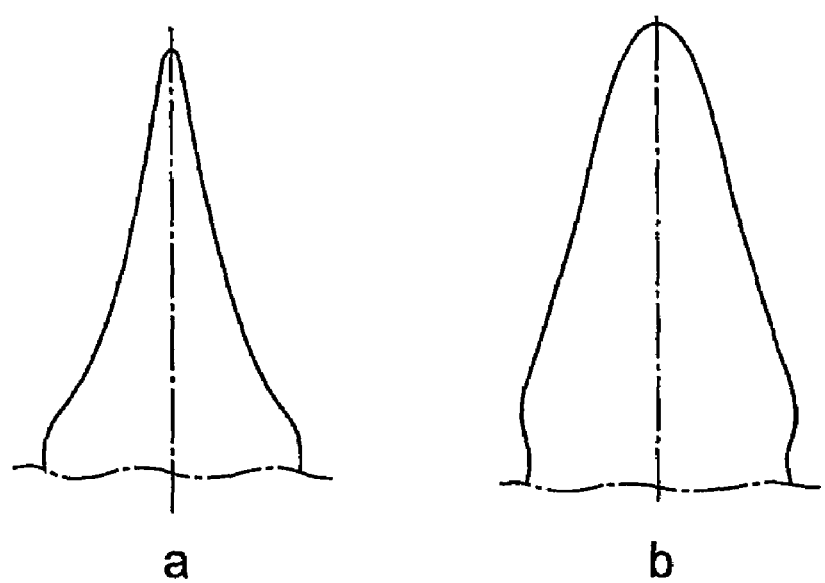
FIG. 5 shows a centering means according to an alternative embodiment of the invention.

In FIG. 5, two alternative forms of centering means are shown. The different forms shown in FIGS. 5a and 5b can be used to provide equal distance between the substrate and each one of the pressing means when the difference in diameter varies between the through-holes in the substrate and the pressing means, respectively. The embodiments described above are merely examples to enable the one skilled in the art to work the invention and they do not limit the invention which is defined by the appended claims.

The invention claimed is:

1. A method for forming at least a first pattern on a substrate, which substrate has at least a first planar surface which is coated with a first layer comprising the steps of:
    arranging the substrate, which has a center hole, and a first pressing means having a first surface provided with a first structure defining the first pattern and further provided with a first through-hole, the center line of which is perpendicular to the first surface and centered in relation to the pattern, on a conical mandrel extending through and in engagement with said center hole and in engagement with said first through-hole, with the first surface of the first pressing means facing and being separated from the first planar surface of the substrate, and the second surface of the second pressing means facing and being separated,
    contacting the pressing means with the substrate while maintaining a common center line, and
    applying a pressure to the first pressing means to form the first pattern in the first layer.

2. A method for forming at least a first pattern and a second pattern on a substrate, which substrate has at least a first planar surface and a second planar surface which are coated with a first layer and a second layer, respectively, comprising the steps of:
    arranging a first pressing means, having a first surface provided with a first structure defining the first pattern provided with a first through-hole, the center line of which is perpendicular to the first surface and centered in relation to the pattern; the substrate, which is provided with a center through-hole; and a second pressing means, having a second surface provided with a second structure defining the second pattern and which is provided with a second through-hole, the center line of which is perpendicular to the second surface and centered in relation to the second pattern, on a conical mandrel extending from and in engagement with said second through-hole, through said center through-hole, into and in engagement with said first through hole, with the first surface of the first pressing means facing and being separated from the first planar surface of the substrate, and the second surface of the second pressing means facing and being separated from the second planar surface of the substrate,
    contacting the pressing means with the substrate while maintaining a common center line, and
    applying a pressure to the first pressing means and the second pressing means to form the patterns in the layers.

3. A method as claimed in claim 2, wherein said mandrel is arranged in engagement with said center through-hole, wherein also the substrate is arranged with its center on the common center line.

4. A method as claimed in any one of claims 1–3, for manufacturing a two-sided rotating storage medium.

5. A method as claimed in claim 4, for manufacturing hard disks.

6. A method for centering a substrate provided with a layer on a first planar surface, in relation to a pressing means having a first surface provided with a first structure defining a first pattern, in a process for transferring said first pattern to said layer by means of pressing, comprising providing a first hole in the center of said first structure, providing a center hole in said substrate, providing a mandrel with a conical portion about a center axis, and bringing the mandrel through and into engagement with said center hole and said first hole, such that said first planar surface and said first surface are arranged parallel to and spaced apart from each other with a common center line along said center axis.

7. A device for forming at least a first pattern from a first pressing means with a first structure on a plate-shaped substrate which substrate is coated with a layer on at least a first planar surface, comprising
    a first holding means and a second holding means for receiving one of the substrate and the first pressing means each, the device being arranged to apply a pressure between the first holding means and the second holding means, and a centering means, which is movable in relation to the second holding means and which is arranged in such a manner that the center of the substrate and the center of the first structure are arranged on a common center line,
    that the first planar surface of the substrate is separated from the structure and that the first pressing means and the substrate are separated from the second holding means and are unable to move perpendicular to the common center line but are able to move freely in a direction along the center line, when the substrate and the first pressing means are arranged on the centering means, when the centering means is in a first working position, with the structure facing the first planar surface, and
    that the first planar surface of the substrate is in contact with the structure and arranged on a common center line, and one of the substrate and the pressing means is in contact with the second holding means when the centering means is in a second working position, the device being arranged to contact the first holding means with the substrate/pressing means pair before a pressure is applied between the first holding means and the second holding means.

8. A device for forming at least a first pattern from a first pressing means with a first structure on a plate-shaped substrate, which substrate is coated with a layer on at least a first planar surface, comprising
a first holding means and a second holding means for receiving one of the substrate and the first pressing means each, the device being arranged to apply a pressure between the first holding means and the second holding means, and a centering means in the form of a mandrel with a conical portion, which is movable in relation to the second holding means and which is arranged in such a manner that the first planar surface of the substrate is separated from the structure and that the first pressing means and the substrate are separated from the holding means, when the substrate and the pressing means are arranged on the centering means when the centering means is in a first working position, and
that the first planar surface of the substrate is in contact with the structure and arranged on a common center line, and one of the substrate and the pressing means is in contact with the second holding means when the centering means is in a second working position, the device being arranged to contact the first holding means with the substrate/pressing means pair before a pressure is applied between the first holding means and the second holding means.

9. A device for forming at least a first pattern and a second pattern on a substrate, which substrate has at least a first planar surface and a second planar surface which are coated with a first layer and a second layer, respectively, comprising a first pressing means, having a first surface provided with a first structure defining the first pattern, and a second pressing means, having a second surface provided with a second structure defining the second pattern and facing said first surface, wherein
a first hole, the center line of which is perpendicular to the first surface and centered in relation to the pattern, is arranged in the first pressing means;
a second hole, the center line of which is perpendicular to the second surface and centered in relation to the second pattern, is arranged in the second pressing means;
the substrate is provided with a center through-hole; and
centering means in the form of a mandrel having a conical portion about a center axis, which mandrel is displaceable in relation to the second pressing means, is introduced from and in engagement with said second hole, through said center through-hole, into and in engagement with said first hole, such that said structures are arranged parallel to and spaced apart from each other, with a common center line along said center axis.

10. A device for centering a substrate provided with a layer on a first planar surface, in relation to a pressing means having a first surface provided with a first structure defining a first pattern, for transferring said first pattern to said layer by means of pressing, wherein a first hole is provided in the center of said first structure, and a center hole is provided in said substrate, and wherein a mandrel provided with a conical portion about a center axis is arranged through and in engagement with said center hole and said first hole, such that said first planar surface and said first surface are arranged parallel to and spaced apart from each other with a common center line along said center axis.

11. A device for centering a first pressing means having a first surface provided with a first structure defining a first pattern, in relation to a second pressing means having a second surface provided with a second structure defining a second pattern, for use in a process where a substrate provided with a first layer on a first planar surface and a second layer on a second planar surface, is placed between said pressing means for transferring said first and second patterns to said first and second layers by means of pressing, wherein a first hole is provided in the center of said first structure, a center hole is provided in said substrate, and a second hole is provided in the center of said second structure, and wherein a mandrel provided with a conical portion about a center axis is arranged through and in engagement with said first hole, through said center hole, and in engagement with said second hole, such that said first and second surfaces are arranged parallel to and spaced apart from each other with a common center line along said center axis.

12. A device as claimed in any one of claims 7–11, wherein said center hole and said first hole are uniform.

13. A device as claimed in claim 9 or 11, wherein said center hole, first hole and said second hole are uniform.

14. A device as claimed in claim 12, wherein said holes are circular.

15. A device as claimed in claim 14, wherein said conical portion is circular in cross-section.

16. A device as claimed in claim 13, wherein said holes are circular.

17. A device as claimed in claim 16, wherein said conical portion is circular in cross-section.

* * * * *